US010040412B2

(12) United States Patent
Leverett, Jr.

(10) Patent No.: US 10,040,412 B2
(45) Date of Patent: Aug. 7, 2018

(54) UTILITY VEHICLE POWER DISTRIBUTION MODULE

(71) Applicant: Deere & Company, Moline, IL (US)

(72) Inventor: David E. Leverett, Jr., North Augusta, SC (US)

(73) Assignee: DEERE & COMPANY, Moline, IL (US)

( * ) Notice: Subject to any disclaimer, the term of this patent is extended or adjusted under 35 U.S.C. 154(b) by 59 days.

(21) Appl. No.: 15/150,891

(22) Filed: May 10, 2016

(65) Prior Publication Data

US 2017/0327064 A1  Nov. 16, 2017

(51) Int. Cl.
*H02G 3/00* (2006.01)
*B60R 16/033* (2006.01)
*H01H 85/02* (2006.01)
*H01H 85/15* (2006.01)
*H02G 3/08* (2006.01)
*B60R 16/023* (2006.01)
*H05K 5/00* (2006.01)
*H02G 3/16* (2006.01)

(52) U.S. Cl.
CPC ........ *B60R 16/033* (2013.01); *B60R 16/0238* (2013.01); *H01H 85/0241* (2013.01); *H01H 85/15* (2013.01); *H02G 3/083* (2013.01); *H05K 5/0043* (2013.01); *H02G 3/16* (2013.01)

(58) Field of Classification Search
None
See application file for complete search history.

(56) References Cited

U.S. PATENT DOCUMENTS

| 5,023,752 A | 6/1991 | Detter et al. |
| 5,067,905 A | 11/1991 | Matsumoto et al. |
| 5,088,940 A | 2/1992 | Saito |
| 5,088,947 A | 10/1992 | Ishitani et al. |
| 5,179,503 A | 1/1993 | Fouts et al. |
| 5,438,310 A | 8/1995 | Ikari |
| 5,504,655 A | 4/1996 | Underwood et al. |
| 5,755,579 A | 5/1998 | Yanase et al. |
| 5,785,532 A | 7/1998 | Maue et al. |
| 5,980,302 A | 11/1999 | Saka |
| 6,396,380 B1 | 5/2002 | Girke et al. |
| 6,848,946 B2 | 2/2005 | Vicenza et al. |

(Continued)

FOREIGN PATENT DOCUMENTS

| EP | 0135910 A2 | 4/1985 |
| EP | 0569820 A1 | 11/1993 |

(Continued)

OTHER PUBLICATIONS

European Search Report issued in counterpart application No. 17170392.9 dated Oct. 9, 2017. (12 pages).

*Primary Examiner* — Lincoln Donovan
*Assistant Examiner* — Khareem E Almo

(57) ABSTRACT

A utility vehicle power distribution module for a plurality of fuses on a first level and a second level of a multi-level housing. Each fuse may be installed between a pair of fuse connection terminals. One of each pair of fuse connection terminals may be connected to an electrical bus bar, and the other of each pair of fuse connection terminals connected to a cable extending through one of a plurality of cable entry and exit openings in an outside wall on a first side and a second side of the multi-level housing.

14 Claims, 3 Drawing Sheets

(56) References Cited

U.S. PATENT DOCUMENTS

| | | |
|---|---|---|
| 6,902,434 B2 | 6/2005 | Stack |
| 7,046,115 B2 | 5/2006 | Higuchi et al. |
| 7,095,628 B2 | 8/2006 | Friedrich et al. |
| 8,587,931 B2 | 11/2013 | Shiraiwa et al. |
| 9,265,164 B2 | 2/2016 | Darr et al. |
| 2004/0048142 A1* | 3/2004 | Marusak ............. B60R 16/0238 429/61 |
| 2004/0189092 A1* | 9/2004 | Burlak ................. B60R 16/023 307/10.1 |
| 2006/0164797 A1* | 7/2006 | Korczynski .......... H01H 85/205 361/626 |
| 2008/0105460 A1* | 5/2008 | Kasai ................... H05K 1/0263 174/527 |
| 2011/0148564 A1 | 6/2011 | Staylor |
| 2014/0305693 A1 | 10/2014 | Greenberg |
| 2015/0069829 A1* | 3/2015 | Dulle ...................... B60R 16/03 307/9.1 |
| 2015/0165992 A1* | 6/2015 | Scheele ............... B60R 16/0239 307/9.1 |
| 2017/0050591 A1* | 2/2017 | Matsumura ......... B60R 16/0238 |
| 2017/0098523 A1* | 4/2017 | Schwartz ........... H01H 85/2045 |
| 2017/0103864 A1* | 4/2017 | Matsumura ............ H02G 3/086 |

FOREIGN PATENT DOCUMENTS

| | | |
|---|---|---|
| EP | 0665570 A2 | 8/1995 |
| EP | 1109190 A1 | 6/2001 |
| EP | 1369305 A2 | 12/2003 |
| EP | 2826674 A2 | 1/2015 |
| GB | 2215916 A | 9/1989 |
| WO | 2015097534 A1 | 7/2015 |

\* cited by examiner

UTILITY VEHICLE POWER DISTRIBUTION MODULE

FIELD OF THE INVENTION

This invention relates to a vehicle power distribution module that houses fuses for utility vehicle electrical systems on tractors and other off road utility vehicles.

BACKGROUND OF THE INVENTION

Power distribution modules or fuse blocks are commonly provided on utility vehicles such as tractors or off road vehicles for housing fuses under the vehicle hood or elsewhere on the chassis near the battery. The utility vehicle power distribution module may be connected to a positive battery cable, and may include an electrical bus bar to a plurality of electrical fuses for protecting electrical systems such as vehicle lighting and other power accessories from high current or power. The fuses may be strip or link fuses connected between pairs of fuse connection terminals which may be threaded studs.

Typically, 60 to 500 amp AMG/MEGA fuses have mounting hole pairs spaced apart by 50 mm on center or more, and 30 to 200 amp AMI/MIDI or ATM/MINI fuses have mounting hole pairs or other terminals spaced apart by 30 mm on center or less. In the past, different power distribution modules were typically used for the larger and smaller fuses, or the overall size of the module and location of fuse mounting terminals was based on the dimensions of the larger fuse. A smaller, more compact utility vehicle power distribution module is needed that can house larger and smaller fuses in the same housing with a smaller footprint because of space demands for other components such as emissions equipment.

In the past, utility vehicle power distribution modules have only limited entry/exit openings for battery cables. For example, the module may have an opening on one side for a cable that is connected to a large fuse or bus bar. It can be difficult to route battery cables around the module into the opening, especially where space is limited and the cables are relatively thick and nonflexible. As a result, it can be difficult to mount power distribution modules at some locations. A utility vehicle power distribution module is needed that reduces or solves the problem of routing battery cables into cable entry or exit openings, and without as many mounting limitations.

SUMMARY OF THE INVENTION

A utility vehicle power distribution module includes a multi-level housing having at least a first level and a second level, each level having fuse connection terminals for installing fuses. The fuses on the second level may be perpendicular to those on the first level, and cable entry/exit openings are provided on each of at least two sides of the bi-level housing to simplify and enable routing battery cables into the module. The power distribution module accommodates larger high current fuses as well as smaller fuses in a small and compact housing.

DESCRIPTION OF THE PREFERRED EMBODIMENT

Figure 1:
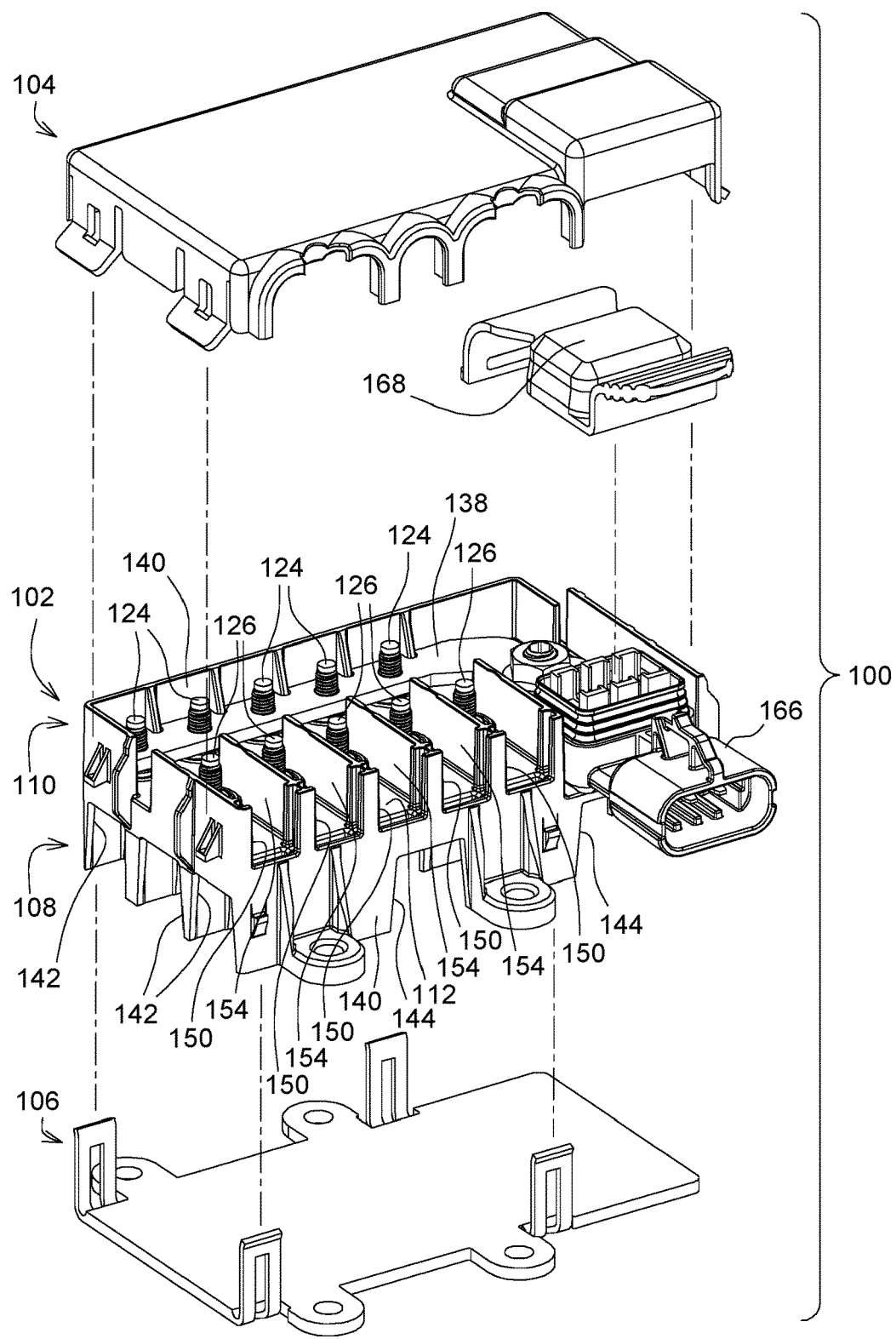
FIG. 1 is an exploded perspective view of a utility vehicle power distribution module according to a preferred embodiment of the invention.
Figure 2:
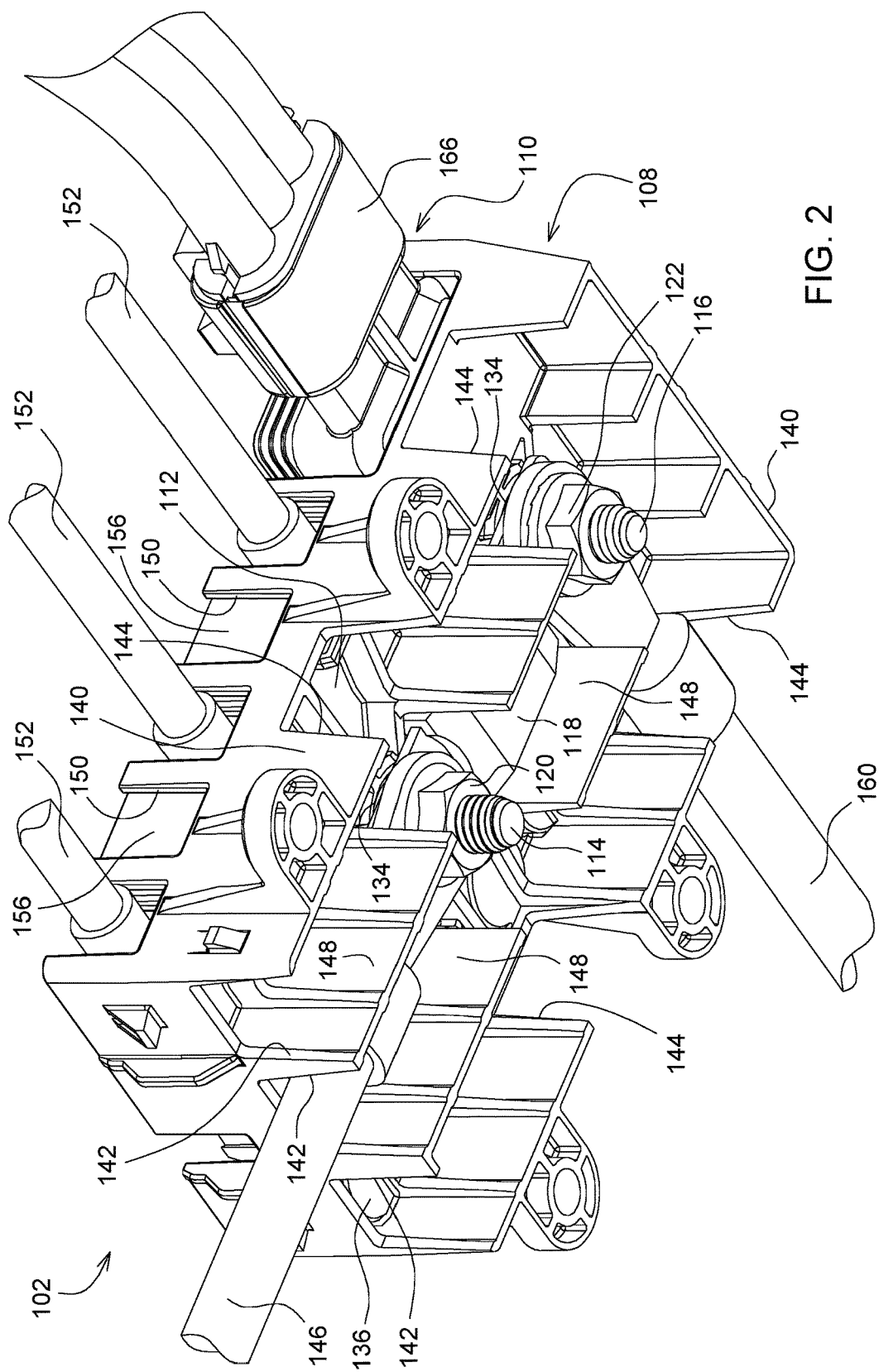
FIG. 2 is a perspective view of the first or lower level of a multi-level housing including cables and a fuse in a utility vehicle power distribution module according to a preferred embodiment of the invention.
Figure 3:
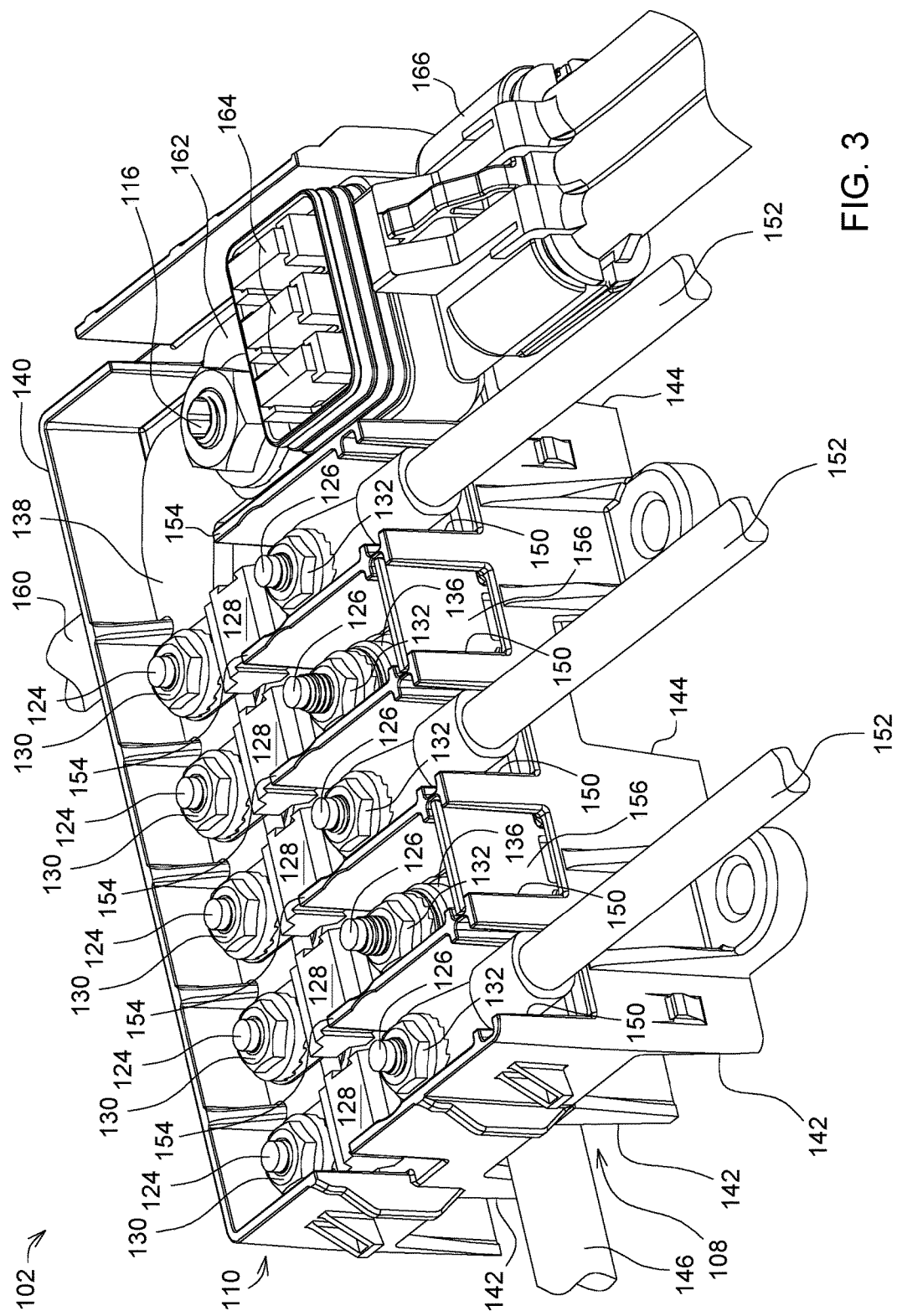
FIG. 3 is a perspective view of the second or upper level of a multi-level housing including cables and fuses in a utility vehicle power distribution module according to a preferred embodiment of the invention.

In the embodiment of the invention shown in FIGS. 1-3, utility vehicle power distribution module 100 may be mounted under the hood or elsewhere on the chassis of a vehicle such as a small tractor or off road utility vehicle. Power may enter the power distribution module via a positive battery cable attached to a terminal located in the first or lower level of multi-level housing 102. The power distribution module accommodates different sized fuses. For example, power may pass through a large high current fuse on the first or lower level of the module, to multiple fuses on the second or upper level of the module. Fuses for utility vehicle electrical systems such as lighting and other power accessories may be installed on the second or upper level of the multi-level housing. The power distribution module also may pass power to the engine starter.

In one embodiment, fuses installed in the utility vehicle power distribution module may be strip, in-line or link fuses. For example, the power distribution module may accommodate fuses such as 60 to 500 amp AMG/MEGA fuses with mounting hole pairs spaced apart by 50 mm on center or more, and 30 to 200 amp AMI/MIDI or ATM/MINI fuses with mounting hole pairs or other terminals spaced apart 30 mm on center or less. The module includes pairs of fuse connection terminals on the first or lower level for larger fuses that are spaced apart by at least 50% more than the pairs of fuse connection terminals on the second or upper level for smaller fuses. Other types of fuses or other electrical components also may be installed in the module and connected to the terminals. The fuse connection terminals shown in FIGS. 1-3 are threaded studs. Alternatively, the fuse connection terminals may include other electrical connectors instead of threaded studs, including any connectors commonly used for installing fuses, or similar components in vehicles.

In one embodiment, utility vehicle power distribution module 100 may include multi-level housing 102 along with an upper cover 104 and lower cover 106. The upper and lower covers may be latched to and removable from the multi-level housing. Fuses may be installed on each level of the multi-level housing. The multi-level housing may include fuse mounting terminals on a first or lower level 108 and a second or upper level 110, with an intermediate shelf or partition 112 between the first and second levels. The embodiment shown in FIGS. 1-3 has two levels, but the multi-level housing of this invention may include three or more levels, each level having fuse mounting terminals connected to the electrical bus bar 134. The levels of the multi-level housing are referred to as a first or lower level and a second or upper level that may be stacked, but the housing also may be oriented and/or mounted so the levels may be side-by-side.

In one embodiment, as shown in FIG. 2, multi-level housing 102 may have at least one pair of fuse connection terminals 114, 116 extending downwardly from partition 112 and into the first level. A strip or link fuse 118 may be installed between the pair of terminals and secured in place with threaded nuts 120, 122. Optionally, additional terminals and fuses also may be provided on the first level.

In one embodiment, as shown in FIG. 3, multi-level housing 102 also may have several pairs of fuse connection terminals 124, 126 extending upwardly from partition 112 into the second level. Strip or link fuses 128 may be installed between the pairs of terminals on the second level and secured in place with threaded nuts 130, 132. Each pair of fuse connection terminals 114, 116 on the first or lower level may be spaced apart by at least 50% more than the pairs of fuse connection terminals 124, 126 on the second or upper level.

In one embodiment, the multi-level housing may include fuse connection terminals arranged so that fuses 128 installed on the second or upper level may be perpendicular to each fuse 118 on the first or lower level of the power distribution module. For example, fuses 128 may be strip or link fuses installed between pairs of fuse connection terminals 124, 126 that are aligned to be parallel with a first or shorter side of the multi-level housing and power distribution module. Fuse 118 may be a strip or link fuse between fuse connection terminals 114 and 116 aligned to be parallel with a second or longer side of the multi-level housing and power distribution module.

In one embodiment, fuse 118 may be a larger, high current fuse installed on the first or lower level of the multi-level housing, and fuses 128 may be smaller, lower current fuses installed side-by-side on the second or upper level. For example, fuse 118 may be a 60 to 500 amp fuse, such as an AMG/MEGA fuse having mounting hole pairs spaced apart by about 50 mm on center or more. Power may enter the power distribution module through battery cable 146 attached to terminal 114, and through fuse 118 connected between terminals 114 and 116. Fuse connection terminal 116 may pass power through electrical bus bar 134 to fuses 128 on the second or upper level. For example, fuses 128 may be 30 to 200 amp AMI/MIDI or ATM/MINI fuses have mounting hole pairs or other terminals spaced apart by 30 mm on center or less. Terminal 116 also may pass power through starter cable 160 to an electric starter for the vehicle engine.

In one embodiment, each pair of fuse connection terminals 114, 116 and 124, 126 may be secured to partition 112 between the first and second levels of the multi-level housing. For example, each terminal may be a threaded stud that is embedded in and/or supported by base 134, 136. Additionally, terminals 124 on the second level may engage and electrically contact bus bar 134, which may be a tin plated copper bar positioned along a second or longer side of the power distribution module. Terminal 116, also referred to as a pass through stud, may extend from the first or lower level through partition 112 to the second or upper level, and may engage and electrically contact bus bar 134.

In one embodiment, utility vehicle power distribution module 100 may have multiple cable entry/exit openings through outer walls 140 on each side of the multi-level housing. Multiple openings allow cables to enter or exit the power distribution module from multiple directions, and allow the module to be mounted in multiple locations and not significantly limited by cable routing restrictions.

In one embodiment, the utility vehicle power distribution module may have multiple cable entry/exit openings through outer walls 140 to the first or lower level on at least two sides of the multi-level housing, and preferably on three or four sides of the multi-level housing. For example, the power distribution module may have three cable entry/exit openings 142 to the first or lower level through the outer walls on the first or shorter side of the multi-level housing, and two cable entry/exit openings 144 to the first or lower level on each of the second or longer sides of the multi-level housing. These openings provide alternatives for battery cables to the larger fuse and electrical bus bar. The module also may have multiple channels for cable routing on the first or lower level, the channels between interior walls 148. FIG. 2 shows battery cable 146 and starter cable 160 inserted through cable entry/exit openings on the first or lower level, in channels between interior walls 148, and connected to terminals 114 and 116.

In one embodiment, the utility vehicle power distribution module may have multiple cable entry/exit openings through outer walls 140 to the second or upper level of the multi-level housing. For example, the power distribution module may have cable entry/exit openings 150 to the second or upper level through the outer walls on the second or longer side of the multi-level housing. Optionally, the module also may have cable entry/exit openings to the second or upper level through the outer walls on another side of the multi-level housing. The module also may have multiple channels for cable routing on the second or upper level, the channels between interior walls 154. As shown in FIG. 3, cables 152 to vehicle circuits may be inserted through cable entry/exit openings on the second or upper level, routed in channels between interior walls 154, and connected to terminals 126. To block dust and debris from entering unused cable entry/exit openings, blocks 156 may be inserted into slots in the edges of the openings.

In one embodiment, the utility vehicle power distribution module also may include smaller fuses 164 installed in mini-fuse module 166 on the second or upper level 110 of the multi-level housing. Fuses 164 may be connected to fuse connection terminals instead of threaded studs. The mini-fuse module also may include link 162 to electrical bus 138, and a multi-pin electrical connector to the electrical systems protected by fuses 164. Cover 168 may be removably attached over mini-fuse module 166.

Having described the preferred embodiment, it will become apparent that various modifications can be made without departing from the scope of the invention as defined in the accompanying claims.

The invention claimed is:

1. A utility vehicle power distribution module, comprising:
   a multi-level housing having a first level with at least one pair of fuse connection terminals and a second level with at least one pair of fuse connection terminals that are aligned perpendicular to the fuse connection terminals on the first level; and
   a plurality of cable entry/exit openings on each of at least two sides of the first level of the multi-level housing; and
   a plurality of channels extending inwardly into the multi-level housing from the plurality of cable entry/exit openings and defined by a plurality of interior walls on the first level and the second level.

2. The utility vehicle power distribution module of claim 1 further comprising an upper cover and a lower cover latched to the multi-level housing.

3. The utility vehicle power distribution module of claim 1 wherein the multi-level housing includes a partition between the first level and the second level, and the fuse connection terminals are mounted to the partition.

4. The utility vehicle power distribution module of claim 1 further comprising at least one in-line fuse on the first level and at least one in-line fuse on the second level are connected to an electrical bus.

5. The utility vehicle power distribution module of claim 1 wherein each pair of fuse connection terminals on the first level is spaced apart by at least 50% more than each pair of fuse connection terminals on the second level.

6. A utility vehicle power distribution module, comprising:
   a multi-level housing having a first level and a second level with in-line fuses installed parallel to a first side of the multi-level housing and parallel to a second side of the multi-level housing;
   an outer wall around the first level and the second level of the multi-level housing having a plurality of cable entry and exit openings through the outer wall; and
   a plurality of interior walls in the first level and the second level, with channels between the walls routing cables between the cable entry and exit openings and the in-line fuses; and
   a block covering at least one of the cable entry and exit openings.

7. The utility vehicle power distribution module of claim 6 further comprising an electrical bus bar on the second level of the multi-level housing and connected to the in-line fuses.

8. The utility vehicle power distribution module of claim 6 wherein the in-line fuses are connected to threaded studs mounted to a partition between the first level and the second level of the multi-level housing.

9. The utility vehicle power distribution module of claim 6 wherein the cable entry and exit openings are through the outer walls on two sides of the multi-level housing.

10. The utility vehicle power distribution module of claim 6 wherein the cable entry and exit openings are through the outer walls on three sides of the multi-level housing.

11. The utility vehicle power distribution module of claim 6 further comprising a pair of fuse connection terminals on the first level that is spaced apart more than a pair of fuse connection terminals on the second level.

12. A utility vehicle power distribution module, comprising:
   a plurality of fuses installed on a first level and a second level of a multi-level housing, with each fuse between a pair of fuse connection terminals;
   one of each pair of fuse connection terminals connected to an electrical bus bar, and the other of each pair of fuse connection terminals connected to a cable extending through one of a plurality of cable entry and exit openings in an outside wall on a first side and a second side of the multi-level housing; and
   a plurality of channels extending from the plurality of cable entry and exit openings inwardly into the multi-level housing, and a plurality of walls between the channels.

13. The utility vehicle power distribution module of claim 12 wherein the fuse connection terminals are threaded studs.

14. The utility vehicle power distribution module of claim 12 further comprising a top cover and a bottom cover latched to the multi-level housing.

\* \* \* \* \*